United States Patent
Zhang

(10) Patent No.: US 10,993,042 B2
(45) Date of Patent: Apr. 27, 2021

(54) MICROPHONE

(71) Applicant: AAC Acoustic Technologies (Shenzhen) Co., Ltd., Shenzhen (CN)

(72) Inventor: Jinyu Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 3 days.

(21) Appl. No.: 16/236,400

(22) Filed: Dec. 29, 2018

(65) Prior Publication Data

US 2019/0238998 A1 Aug. 1, 2019

(30) Foreign Application Priority Data

Jan. 31, 2018 (CN) .......................... 201820170813.9

(51) Int. Cl.
| | |
|---|---|
| H04R 19/04 | (2006.01) |
| H04R 1/04 | (2006.01) |
| H04R 7/04 | (2006.01) |
| B81B 3/00 | (2006.01) |
| H04R 19/00 | (2006.01) |

(52) U.S. Cl.
CPC ........... *H04R 19/04* (2013.01); *B81B 3/0072* (2013.01); *H04R 1/04* (2013.01); *H04R 7/04* (2013.01); *B81B 2201/0257* (2013.01); *B81B 2203/0127* (2013.01); *H04R 19/005* (2013.01); *H04R 2201/003* (2013.01)

(58) Field of Classification Search
CPC .... H04R 19/005; H04R 19/016; H04R 19/04; H04R 2201/003
See application file for complete search history.

(56) References Cited

U.S. PATENT DOCUMENTS

| | | | | |
|---|---|---|---|---|
| 7,171,012 | B2 * | 1/2007 | Izuchi .................. | H04R 19/016 381/174 |
| 7,943,413 | B2 * | 5/2011 | Kasai ..................... | H04R 19/04 438/53 |
| 8,144,906 | B2 * | 3/2012 | Daley .................... | H04R 1/086 381/322 |
| 8,969,980 | B2 * | 3/2015 | Lee ....................... | B81B 7/0029 257/416 |
| 9,066,180 | B2 * | 6/2015 | Zoellin ................. | H04R 19/04 |
| 9,170,164 | B2 * | 10/2015 | Naegele-Preissmann ................... | G01L 1/148 |
| 9,326,081 | B2 * | 4/2016 | Momotani ........... | H04R 31/006 |
| 9,380,380 | B2 * | 6/2016 | Kasai .................... | H04R 31/00 |
| 9,521,491 | B2 * | 12/2016 | Inoue .................... | H04R 19/04 |
| 9,994,440 | B2 * | 6/2018 | Jenkins ................ | B81B 3/0072 |
| 10,006,824 | B2 * | 6/2018 | Tsai ..................... | H04R 19/005 |

FOREIGN PATENT DOCUMENTS

JP 2010114776 A * 5/2010

* cited by examiner

*Primary Examiner* — Ryan Robinson
(74) *Attorney, Agent, or Firm* — IPro, PLLC; Na Xu

(57) ABSTRACT

A microphone is provided, including a base having a chamber; and a capacitor system fixed to the base. The capacitor system includes a backplate fixed to the base and a diaphragm located in the chamber. The backplate and the diaphragm form a capacitor structure. The diaphragm is fixed to the backplate and partitions the chamber into a front chamber and a back chamber. The backplate is provided with a sound receiving hole in communication with the front chamber. The base or the backplate is provided with a vent hole for communicating the back chamber with the outside. The microphone provided by the present disclosure has the advantages of high reliability.

3 Claims, 4 Drawing Sheets

MICROPHONE

CROSS-REFERENCE TO RELATED APPLICATIONS

The present application claims priority to Chinese Patent Application No. 201820170813.9, filed on Jan. 31, 2018, the content of which is incorporated herein by reference in its entirety.

TECHNICAL FIELD

The present disclosure relates to the field of electric-acoustic technologies, and in particular, to a microphone.

BACKGROUND

With the rapid development of portable electronic terminals, microphones being important acoustic components of portable electronic terminals are also continuously improved. In the related art, a microphone includes components such as a backplate, a diaphragm, and the like. In processes of dropping and air blowing, in order to avoid damage to the microphone by excessive large air pressure in a back chamber, a solution in the related art is to provide a vent hole on the diaphragm adjacent to the back chamber so as to communicate the vent hole with the sound receiving hole on the backplate, therefore a portion of an airflow can be released via the vent hole and the sound receiving hole, thereby reducing the air pressure in the back chamber.

The inventors of the present disclosure have found that the following problems exist in the related art. Arranging the vent hole on the diaphragm is liable to cause the strength of the diaphragm to decrease, and particulate substance or volatilization substance in the back chamber may also enter a space between the backplate and the diaphragm via the vent hole on the diaphragm. These two reasons may affect the normal operation of the diaphragm, resulting in low reliability of the microphone. Therefore, it is necessary to propose a new microphone to solve the above problems.

DESCRIPTION OF EMBODIMENTS

In order to better understand objectives, technical solutions and advantages of the present disclosure, the embodiments of the present disclosure are described in details with reference to the accompanying drawings. However, it will be apparent to those skilled in the art that, in the various embodiments of the present disclosure, a number of technical details are set forth in order to provide a better understanding of the present disclosure. However, the technical solutions described in the present disclosure can be implemented without these technical details, and various changes and modifications can be made based on the following embodiments.

Figure 1:
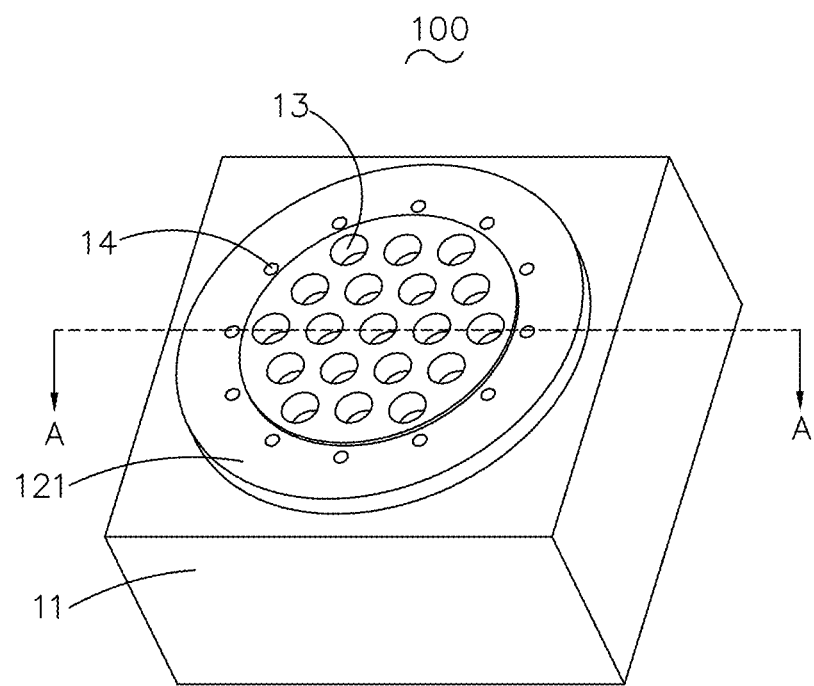
FIG. 1 is a schematic perspective view of a microphone according to a first embodiment of the present disclosure.
Figure 2:
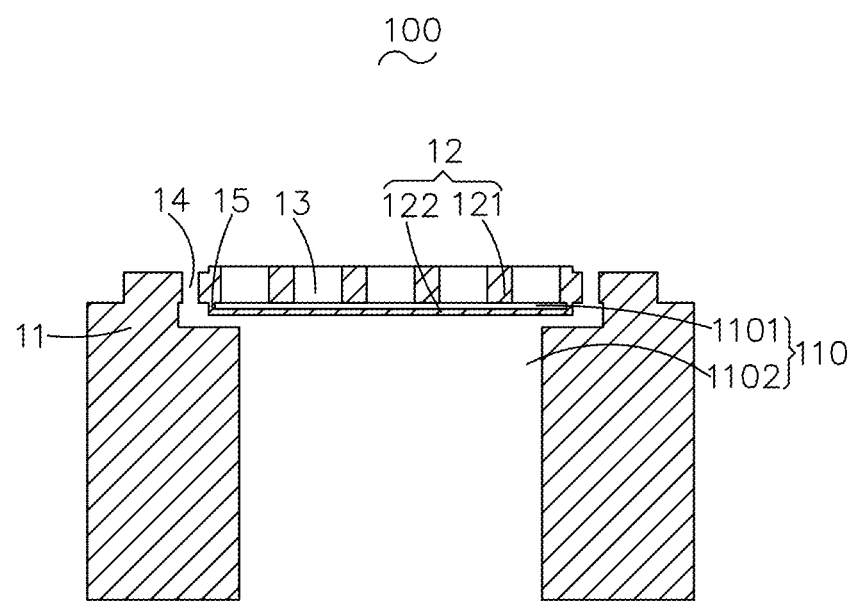
FIG. 2 is a cross-sectional structural diagram of the microphone taken along line A-A in FIG. 1.

A first embodiment of the present disclosure relates to a microphone 100. As shown in FIGS. 1 and 2, the microphone 100 includes a base 11 having a chamber 110 and a capacitor system 12 fixed to the base 11. The capacitor system 12 includes a backplate 121 fixed to the base 11 and a diaphragm 122 located in the chamber 110 and formed a capacitor structure together with the backplate 121. The diaphragm 122 is fixed to the backplate 121 and partitions the chamber 110 into a front chamber 1101 and a back chamber 1102. The back plate 121 is provided with a sound receiving hole 13 in communication with the front chamber 1101. The backplate 121 is provided with a vent hole 14 for communicating the back chamber 1102 with the external environment.

Compared with the related art, in an embodiment of the present disclosure, providing the vent hole 14 on the backplate 121 instead of the diaphragm 122 can avoid reduction of the strength of the diaphragm 122 caused by providing the vent hole 14 on the diaphragm 122, so that the diaphragm 122 can be prevent from vibrating abnormally due to the reduction of the strength. In addition, the venting hole 14 communicates the back chamber 1102 with the outside while not communicating the back chamber 1102 with the front chamber 1101, thereby avoiding particulate substance or volatilization substance in the back chamber 1102 from entering into the front chamber 1101 via the vent hole 14 to affect the normal vibration of the diaphragm 122. Therefore, the normal operation of the diaphragm 122 can be ensured, and the reliability of the microphone 100 can be improved. Further, in this way, it is possible to check whether there are particulate substance or volatilization substance in the vicinity of the vent hole 14 from a surface of the backplate 121 of the microphone 100.

In one embodiment, the vent hole 14 is located outside of the front chamber 1101, thus avoiding that arranging the vent hole 14 within the front chamber 1101 cannot achieve the effect of communicating the back chamber 1102 with the outside.

It should be noted that the number of the vent hole 14 is more than one. A plurality of venting holes 14 can achieve rapid discharge of the airflow in the back chamber 1102 so as to avoid damage to the microphone 100 caused by dropping or excessive large airflow during an air blowing process.

It is worth mentioning that the microphone 100 further includes a connection portion 15 arranged between the backplate 121 and the diaphragm 122. The diaphragm 122 is fixed on the backplate 121 via the connection portion 15. The backplate 121, the connection portion 15 and the diaphragm 122 jointly encloses to form the front chamber 1101. The backplate 121, the connection portion 15, the diaphragm 122 and the base 11 jointly enclose to form the back chamber 1102.

Figure 3:
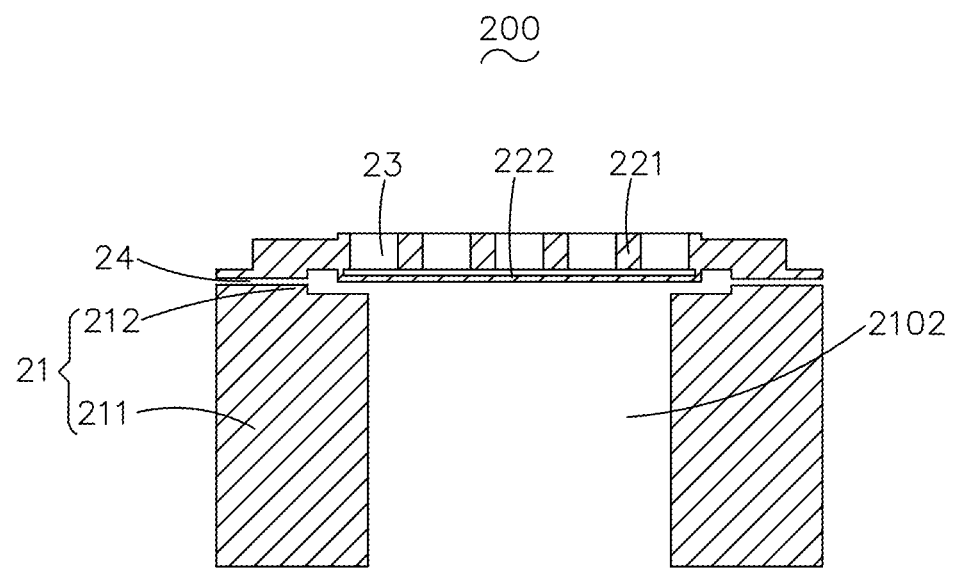
FIG. 3 is a schematic cross-sectional structural diagram of a microphone according to a second embodiment of the present disclosure.

A second embodiment of the present disclosure relates to a microphone 200. As shown in FIG. 3, the microphone 200 includes a base 21, a backplate 221 and a diaphragm 222. The backplate 221 is provided with a sound receiving hole 23. The second embodiment is substantially the same as the first embodiment. A main difference therebetween lies in that in the first embodiment, the vent hole 14 is provided on the backplate 121, but in the second embodiment of the present disclosure, the vent hole 24 is provided on the base 21. Providing the vent hole 24 on the base 21 can also avoid the reduction of the strength of the diaphragm 122 caused by providing the vent hole 14 on the diaphragm 122, thereby avoiding that the diaphragm 122 cannot vibrate normally due to the reduction of the strength of the diaphragm 122. In addition, the venting hole 14 communicates the back chamber 1102 with the outside while not communicating the back chamber 1102 with the front chamber 1101, thereby avoiding that particulate substance or volatilization substance in the back chamber 1102 from entering into the front chamber 1101 via the vent hole 14 to affect the normal vibration of the diaphragm 122. Therefore, the normal operation of the diaphragm 122 can be ensured, and the reliability of the microphone 100 can be improved. Moreover, since the vent hole 24 is not provided on the backplate 221, the structural strength of the backplate 221 can be kept as large as possible, so that the backplate 221 can be prevented from being damaged due to an insufficient strength thereof.

In one embodiment of the present disclosure, the base 21 includes a base portion 211 and a supporting portion 212. The supporting portion 212 is arranged on the base portion 211. The supporting portion 212 supports the backplate 221.

Figure 4:
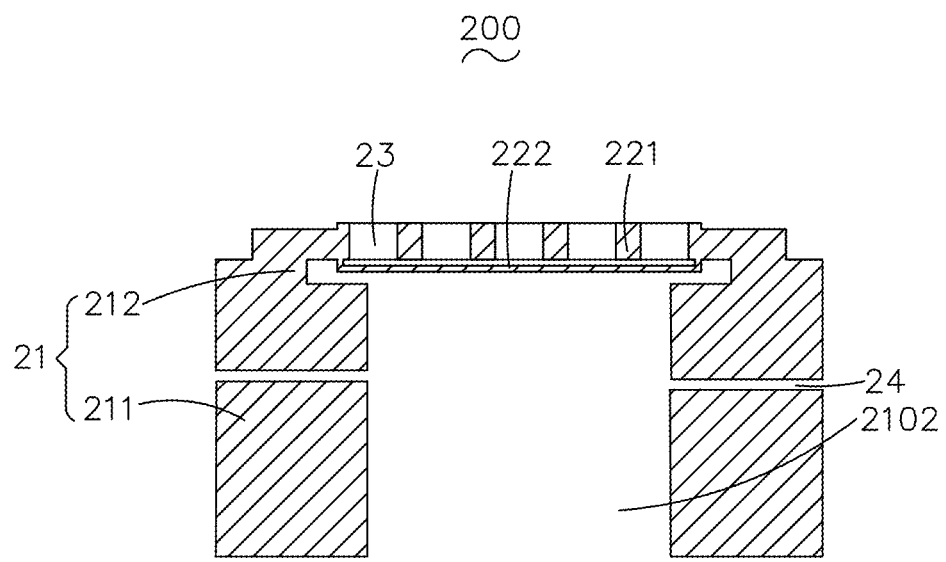
FIG. 4 is a schematic cross-sectional structural diagram of a microphone according to a third embodiment of the present disclosure.

In one embodiment, as shown in FIG. 3, a vent hole 24 is provided on the supporting portion 212. When an air pressure in the back chamber 2102 is excessively large, the airflow can be discharged to the outside of the back chamber 2102 via the vent hole 24 on the supporting portion 212, thereby avoiding damage to the microphone 200 due to excessive large air pressure in the back chamber 2102. It should be noted that, in a third embodiment as shown in FIG. 4, the vent hole 24 can also be arranged on the base portion 211, so that the discharge effect can also be achieved, thus avoiding damage to the microphone 200 due to excessive large air pressure in the back chamber 2102.

It should be noted that the number of the vent hole 24 is more than one. A plurality of venting holes 24 can achieve rapid discharge of the airflow in the back chamber 2102 so as to avoid damage to the microphone 200 caused by dropping or excessive large airflow during an air blowing process.

A person skilled in the art can understand that the above embodiments are specific embodiments for implementing the present disclosure, and various changes can be made in practical application without departing from the spirit and scope of the present disclosure.

What is claimed is:

1. A microphone, comprising:
   a base having a chamber; and
   a capacitor system fixed to the base, the capacitor system comprising a backplate fixed to the base and a diaphragm completely located in the chamber,
   wherein the backplate and the diaphragm form a capacitor structure, and
   wherein the diaphragm is fixed to the backplate and partitions the chamber into a front chamber and a back chamber, the microphone includes a connection portion located between the backplate and the diaphragm, an outer edge of diaphragm is fixed to the backplate via the connection portion, and the backplate, the connection portion and the diaphragm together enclose the front chamber, the backplate is provided with a sound receiving hole in communication with the front chamber, and the base or the backplate is provided with a vent hole for communicating the back chamber with outside, the vent hole is defined in the backplate and located outside the front chamber.

2. The microphone as described in claim 1, wherein the base comprises a base portion and a supporting portion arranged on the base portion, and the backplate is supported by the supporting portion.

3. The microphone as described in claim 1, wherein more than one vent hole is provided.

* * * * *